(12) United States Patent
Jiao et al.

(10) Patent No.: US 11,723,161 B2
(45) Date of Patent: Aug. 8, 2023

(54) FRAME FOR INSTALLING ARC-SHAPED LED DISPLAY SCREEN COMPOSED OF LED DISPLAY MODULES

(71) Applicant: YAHAM OPTOELECTRONICS CO., LTD, Guangdong (CN)

(72) Inventors: Weiqi Jiao, Guangdong (CN); Xiaodong Wei, Guangdong (CN); Zhenquan Fan, Guangdong (CN); You Zeng, Guangdong (CN)

(73) Assignee: YAHAM OPTOELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 17/506,113

(22) Filed: Oct. 20, 2021

(65) Prior Publication Data

US 2023/0118147 A1    Apr. 20, 2023

(51) Int. Cl.
*H05K 5/02* (2006.01)
*H05K 5/00* (2006.01)

(52) U.S. Cl.
CPC ......... *H05K 5/0217* (2013.01); *H05K 5/0021* (2013.01)

(58) Field of Classification Search
USPC ................................. 361/728, 731
See application file for complete search history.

(56) References Cited

U.S. PATENT DOCUMENTS

2016/0234959 A1*  8/2016  Kuang ................. G09F 9/3026

FOREIGN PATENT DOCUMENTS

| CN | 203910193 | * 10/2014 | ............... H05K 7/20 |
| CN | 205428400 | *  8/2016 | ............... G09F 9/33 |

* cited by examiner

*Primary Examiner* — Hung S. Bui
(74) *Attorney, Agent, or Firm* — Cantor Colburn LLP

(57) ABSTRACT

A frame for installing an arc-shaped LED display screen composed of a plurality of LED display modules. The top partition panel and the bottom partition panel have arc edges with the same arc, and are parallel to and spaced apart from each other and both fixed to the primary support, the secondary support, the plurality of module supports, the left support, and the right support. The left support, the right support, and the plurality of module supports are equally spaced apart and fixed along the arc edge of each of the top partition panel and the bottom partition panel, and are configured to connect the plurality of LED display modules, to achieve a seamless assemblage of the arc-shaped LED display screen.

19 Claims, 11 Drawing Sheets

FRAME FOR INSTALLING ARC-SHAPED LED DISPLAY SCREEN COMPOSED OF LED DISPLAY MODULES

BACKGROUND OF THE INVENTION

Technical Field

The present application relates to the technical field of devices for installing a LED display screen, and more particularly to a frame for installing an arc-shaped LED display screen composed of a plurality of LED display modules.

Description of the Related Art

The statements herein only provide background information related to the present application, and do not necessarily constitute prior art.

An existing frame for arc-shaped LED display screen generally adopts a sheet metal frame or a profile frame, however, such frame has poor dimensional accuracy, the LED modules assembled have poor angular accuracy and flatness, and the frame has relatively weak structural strength, which requires additional steel structure for supporting, and thus cannot be installed individually.

SUMMARY OF THE INVENTION

In view of the above-described problems, it is one objective of the present application to provide a frame for installing an arc-shaped LED display screen which aims at solving the technical problem that the existing frame has poor dimensional accuracy, the LED modules assembled have poor angular accuracy and flatness, and the frame has relatively weak structural strength.

To achieve the above objectives, in accordance with one embodiment of the present application, there is provided a frame for installing an arc-shaped LED display screen composed of a plurality of LED display modules. The frame comprises: a top partition panel and a bottom partition panel. Each of the top partition panel and the bottom partition panel is a planar panel and comprises: an arc edge having the same arc; a linear edge opposite to the arc edge; and a left edge and a right edge in connection with the arc edge and the linear edge respectively at a left side and a right side.

The frame further comprises: a primary support, a secondary support, a plurality of module supports, a left support, and a right support.

The top partition panel and the bottom partition panel are parallel to and spaced apart from each other and are both fixed to the primary support, the secondary support, the plurality of module supports, the left support, and the right support.

The left support and the right support are configured to support the top partition panel and the bottom partition panel, at the left edge and the right edge, respectively.

The left support, the right support, and the plurality of module supports are equally spaced apart and fixed along the arc edge of each of the top partition panel and the bottom partition panel, and are configured to connect the plurality of LED display modules, to achieve a seamless assemblage of the arc-shaped LED display screen.

Advantages of the frame for installing an arc-shaped LED display screen composed of a plurality of LED display modules according to embodiments of the present application are summarized below:

The top partition panel and the bottom partition panel are parallel to and spaced apart from each other and fixed to the primary support, the secondary support, the plurality of module supports, the left support, and the right support. Thus, the integral frame has enhanced structural strength and high stability, which further enables to remove steel structures and to directly bearing forces by the frame structure. The left support, the right support, and the plurality of module supports are equally spaced apart and fixed along the arc edge of different partition panels, such that when the plurality of LED display modules are installed to the module supports, a seamless assemblage of the arc-shaped LED display screen in consistent with the arc edges is achieved.

BRIEF DESCRIPTION OF THE DRAWINGS

The present application is described hereinbelow with reference to the accompanying drawings, in which.

Figure 1:
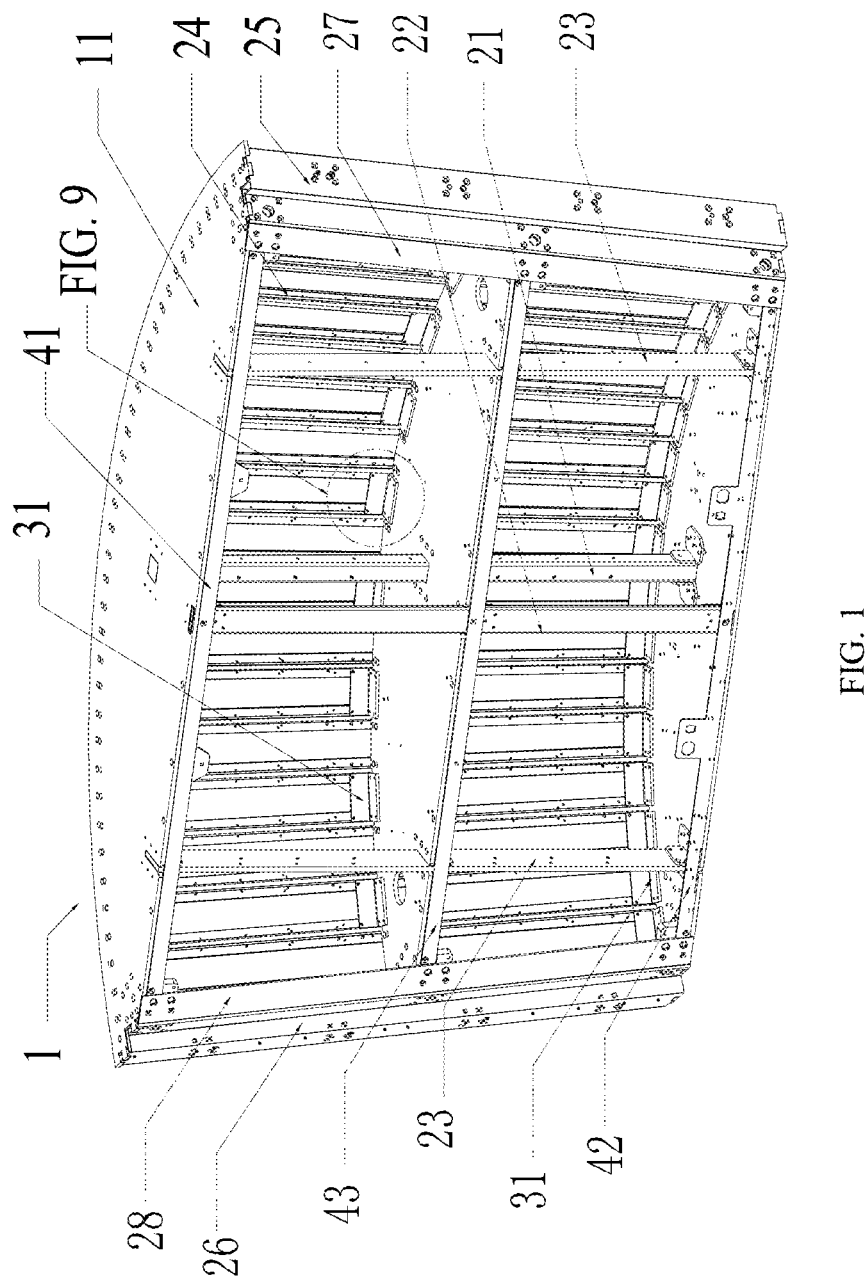
FIG. 1 is top, rear, left side perspective view of a frame for installing an arc-shaped LED display screen according to an embodiment of the present application with a back cover removed.

In the drawings, the following reference numbers are used:

1: Frame; 8: Arc-shaped LED display screen; 80: LED display modules;
11: Top partition panel; 12: Bottom partition panel; 13: Intermediate partition panel;
111, 121, 131: Arc edge; 112, 122, 132: Linear edge; 112A, 112B: First step structures; 122A, 122B: Second step structures;
118, 128, 138: Left edge;
119, 129, 139: Right edge;
115, 125, 135: First openings;
116, 126, 136: Second openings;
117, 127, 137: Third openings;
114, 124, 134: Third through holes;
21: Primary support;
22: Secondary support;
23: Tertiary supports;
24: Module supports; 241: First longitudinal strip; 242: Second longitudinal strip; 243: Guide block; 243A: First end face; 243B: Second end face; 244: Stiffener; 245: First through holes; 246: Second through holes;

25: Left support; 251: Left longitudinal strip;

26: Right support; 261: Right longitudinal strip;

27: Left baffle;

28: Right baffle;

31: L-shaped fixation members; 311: First fixation surface; 312: Second fixation surface; 133: Notches; 314: Second mounting holes; 31A: First L-shaped fixation members; 31B: Second L-shaped fixation members; 31C: Third L-shaped fixation members; 31D: Fourth L-shaped fixation members

41: Top crossbeam, 42: Bottom crossbeam; 43: Intermediate crossbeam 43; 411, 421, 431: First crossbeam surface; 412, 422, 432: Second crossbeam surface;

50: Back cover; and 51: Handle.

DETAILED DESCRIPTION OF THE EMBODIMENTS

In order to make the purposes, technical solutions, and advantages of the present application clearer and more understandable, the present application will be further described in detail hereinafter with reference to the accompanying drawings and embodiments. It should be understood that the embodiments described herein are only intended to illustrate but not to limit the present application.

It should be noted that when an element is described as "fixed" or "arranged" on/at another element, it means that the element can be directly or indirectly fixed or arranged on/at another element. When an element is described as "connected" to/with another element, it means that the element can be directly or indirectly connected to/with another element. An element is described as "proximate to" or "in the proximity of/to" another element, it means that the element is arranged near or close to another element. Terms "upper", "lower", "left", "right", and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application. The terms "first" and "second" are adopted for descriptive purposes only and are not to be construed as indicating or implying a relative importance or implicitly indicating the number of technical features indicated. The meaning of "a plurality of" or "multiple" is two or more unless otherwise specifically defined.

Technical solutions of the present application will be described in details in combination with the specific drawings and embodiments.

As shown in FIGS. 1-2 and 5-7, a frame 1 for installing an arc-shaped LED display screen 8 composed of a plurality of LED display modules 80 is provided. The frame comprises: a top partition panel 11 and a bottom partition panel 12. Each of the top partition panel 11 and the bottom partition panel 12 is a planar panel and comprises: an arc edge 111, 121 having the same arc, a linear edge 112, 122 opposite to the arc edge 111, 121, and a left edge 118, 128 and a right edge 119, 129 in connection with the arc edge 111, 121 and the linear edge 112, 122 respectively at a left side and a right side. The frame further comprises: a primary support 21, a secondary support 22, a plurality of module supports 24, a left support 25, and a right support 26. The top partition panel 11 and the bottom partition panel 12 are parallel to and spaced apart from each other and fixed to the primary support 21, the secondary support 22, the plurality of module supports 24, the left support 25, and the right support 26. The left support 25 and the right support 26 are configured to support the top partition panel 11 and the bottom partition panel 12 at the left edge 118, 128 and the right edge 119, 129, respectively. The left support 25, the right support 26, and the plurality of module supports 24 are equally spaced apart and fixed along the arc edge 111, 121, 131 of each of the top partition panel 11, and the bottom partition panel 12, and are configured to connect the plurality of LED display modules, to achieve a seamless assemblage of the arc-shaped LED display screen.

In the frame having the above-described structure, the top partition panel 11 and the bottom partition panel 12 are parallel to each other and spaced apart from each other in the vertical direction and fixed to the primary support 21, the secondary support 22, the plurality of module supports 24, the left support 25, and the right support 26. Thus, the integral frame has enhanced structural strength and high stability, which further enables to remove steel structures and to directly bearing forces by the frame structure. The left support 25, the right support 26, and the plurality of module supports 24 are equally spaced apart and fixed along the arc edge 111, 121, 131 of different partition panels, such that when the plurality of LED display modules are installed to the module supports, a seamless assemblage of the arc-shaped LED display screen in consistent with the arc edges is achieved.

Figure 6:
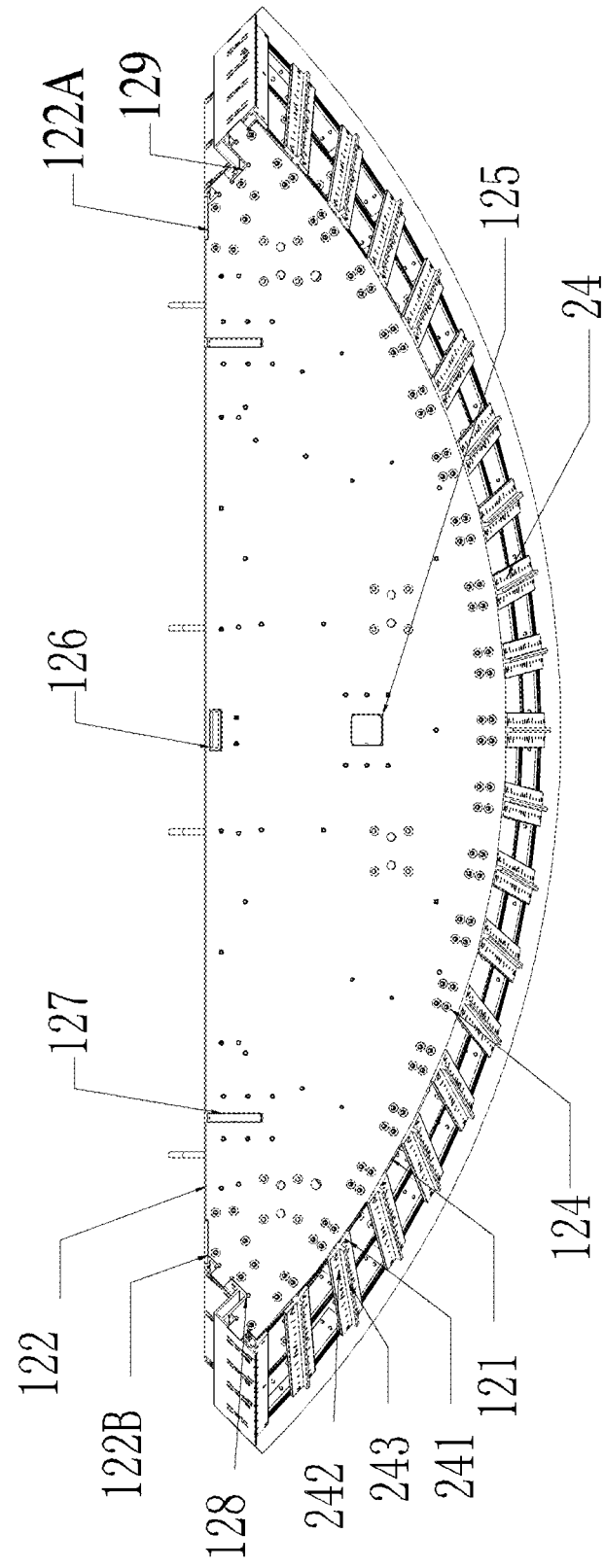
FIG. 6 is a bottom view of a frame for installing an arc-shaped LED display screen according to an embodiment of the present application.
Figure 9:
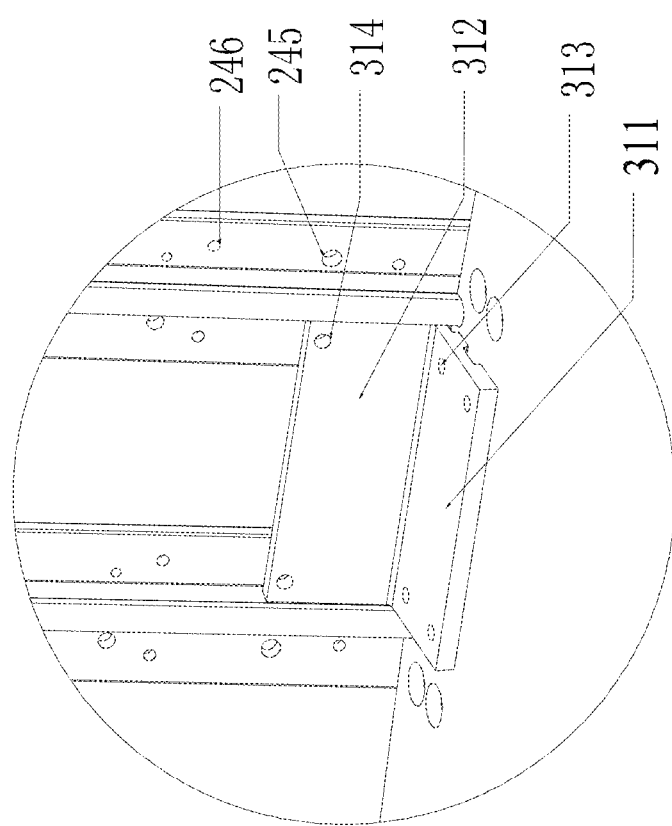
FIG. 9 is an enlarged view of a portion of FIG. 1.
Figure 10:
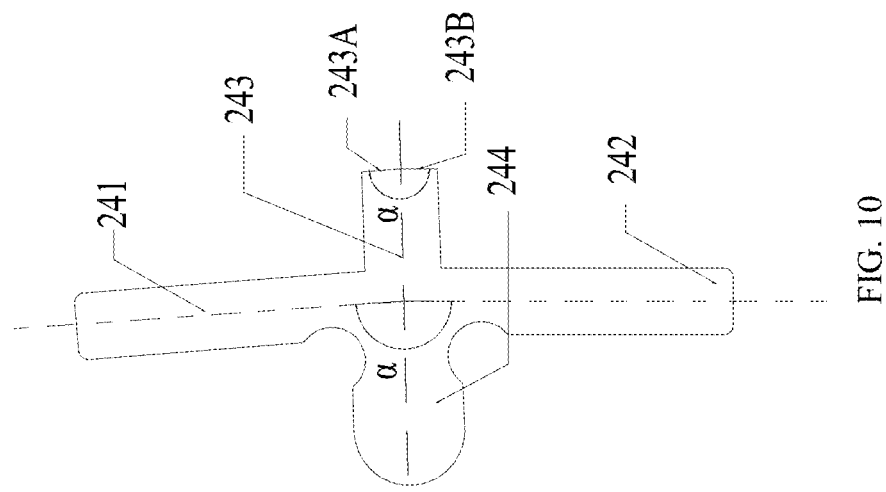
FIG. 10 is a top view of a single module support according to an embodiment of the present application.
Figure 11:
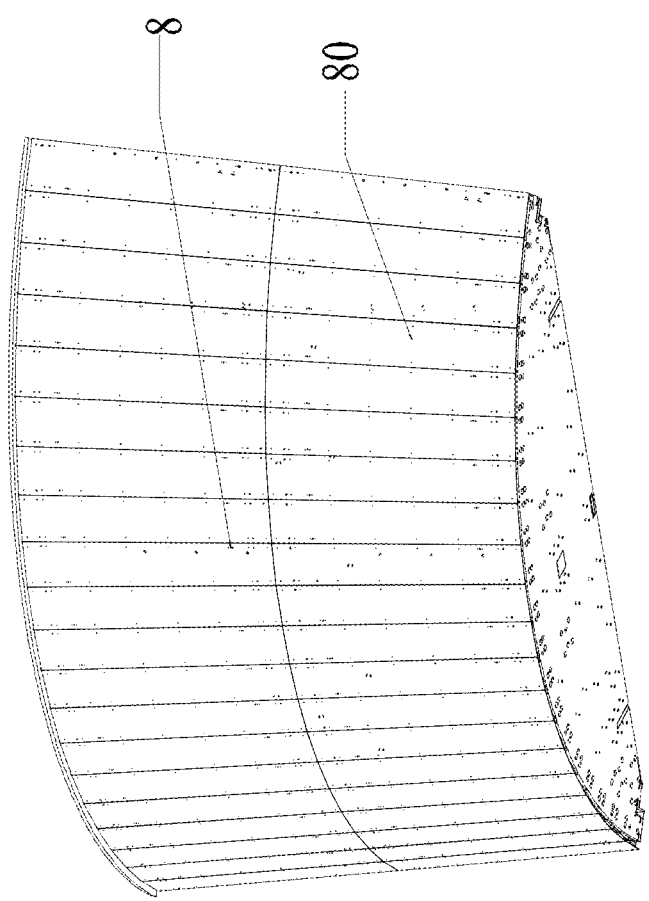
FIG. 11 is a perspective view of a frame according to an embodiment of the present application, when LED display modules are fixed thereto.

As shown in FIGS. 6, 9-10, in some embodiments of the present application, each of the plurality of module supports 24 comprises: a first longitudinal strip 241 and a second longitudinal strip 242, which are configured to connect with the plurality of LED display modules. The first longitudinal strip 241 and the second longitudinal strip 242 are bent at an intersection portion thereof towards the arc edge 111, 121, 131 to form an included angle α between the first longitudinal strip 241 and the second longitudinal strip 242. The included angle α is smaller than 180 degree and satisfies that when the plurality of module supports 24 are installed in positions, cross sections of all the first longitudinal strips 241 and all the second longitudinal strips 242 are in an arc arrangement corresponding to the arc edge 111, 121, 131.

In some embodiments of the present application, as shown in FIGS. 6, 9-10, each of the plurality of module supports 24 further comprises: a guide block 243, which is convex at the intersection portion of the first longitudinal strip 241 and the second longitudinal strip 242 in a direction away from the arc edge 111, 121, 131. An end face of the guide block 243 away from the arc edge 111, 121, 131 is symmetrically bent along a bisector line of the included angle α to form a first end face 243A and a second end face 243B, wherein an included angle between the first end face 243A and the second end face 243B is the same as the included angle α. In this way, it can be ensured that the first end face 243A of the guide block 243 is in parallel to the first longitudinal strip 241, and the second end face 243B of the guide block 243 is in parallel to the second longitudinal strip 242. Thus, when assembled, LED display modules are guided by the first end face 243A and the second end face 243B of the guide block 243 to be fixed in parallel to the first longitudinal strip 241 and the second longitudinal strip 242, such that an assembled arc-shaped LED display screen corresponds to the arc arrangement of the arc edges, in a seamless manner between adjacent LED display modules. In practice, the installation time can be shortened due to the excellent assembled effect.

In some embodiments of the present application, each of the plurality of module supports 24 further comprises: a stiffener 244, which is convex at the intersection portion of the first longitudinal strip 241 and the second longitudinal strip 242 in a direction facing the arc edge 111, 121, 131.

In some embodiments of the present application, as shown in shown in FIGS. 1-2 and 5-7, the frame further comprises at least one intermediate partition panel 13. The at least one intermediate partition panel 13 is a planar panel and comprises: an arc edge 131; a linear edge 132 opposite to the arc edge 131, and a left edge 138 and a right edge 139 in connection with the arc edge 131 and the linear edge 132 respectively at a left side and a right side. The arc edge 131 of the at least one intermediate partition panel 13 has the same arc as the arc edges 111, 121 of the top partition panel 11 and the bottom partition panel 12, wherein centers of circles of the respective arc edges 111, 121, 131 are disposed on a same line. The at least one intermediate partition panel 13 is fixed to the primary support 21, the secondary support 22, the plurality of module supports 24, the left support 25, and the right support 26, and arranged between and in parallel to the top partition panel 11 and the bottom partition panel 12.

In some embodiments, the arc edge 131 of the at least one intermediate partition panel 13 is provided with notches 133 arranged at equal intervals. Each of the notches 133 has a shape fitting with a cross section of the stiffener 244 to receive the stiffener 244.

It should be understood that the shape of the cross-section of the stiffener 244 is not limited here. In some embodiments, the stiffener 244 may have an arc-shaped cross-section, and the notch 133 may be a corresponding arc shape. In some other embodiments, the stiffener 244 may have a trapezoidal cross-section, and the notch 133 may be a corresponding trapezoid.

It should be understood that the top partition panel and the bottom partition panel may also be provided with corresponding notches at equal intervals on their arc edges to accommodate the two ends of the stiffeners, or alternatively, the lower planar surface of the top partition panel and the upper planar surface of the bottom partition panel may be recessed at corresponding positions along their arc edges to accommodate the two ends of the stiffeners. Or alternatively, the top partition panel and the bottom partition panel may not be provided with corresponding notches or recesses, and the two ends of the stiffeners are just in contact with the lower planar surface of the top partition panel and the upper planar surface of the bottom partition panel.

In some embodiments of the present application, as shown in FIG. 9, the first longitudinal strip 241 and the second longitudinal strip 242 have symmetrical structures along the bisector line of the included angle α between the first longitudinal strip 241 and the second longitudinal strip 242. Each of the first longitudinal strip 241 and the second longitudinal strip 242 defines therein first through holes 245. The first through holes 245 are configured to connect the corresponding first longitudinal strip 241 or second longitudinal strip 242 with the plurality of L-shaped fixation members 31 via connecting pieces, such that the plurality of module supports 24 are fixed to the top partition panel 11, the bottom partition panel 12, and the at least one intermediate partition panel 13 via the plurality of L-shaped fixation member 31.

The connecting pieces are not uniquely limited herein, for example, the connecting pieces may be bolts and screws.

In some embodiments of the present application, as shown in FIGS. 6 and 9, each of the first longitudinal strip 241 and the second longitudinal strip 242 defines therein second through holes 246. The second through holes 246 of each of the first longitudinal strip 241 and the second longitudinal strip 242 are configured to connect each of the plurality of module supports 24 to one of the plurality of LED display modules via connecting pieces. For example, the connecting pieces may be screw and bolts.

The connection between the first longitudinal strip 241 and the second longitudinal strip 242 and the LED display modules may be realized by other different connection manners. For example, outer surfaces of the first and second longitudinal strips are welded with iron strips, and magnetic strips are correspondingly attached to the connection surfaces of the LED display modules.

In some embodiments of the present application, as shown in FIG. 9, each of the plurality of L-shaped fixation members 31 comprises a first fixation surface 311 and a second fixation surface 312, which form an included angle therebetween. The first fixation surface 311 is in connection with one of the top partition panel 11, the bottom partition panel 12, and the at least one intermediate partition panel 13. The second fixation surface 312 is in connection with one of the plurality of module supports 24.

In some embodiments of the present application, as shown in in FIGS. 5-7 and 9, the first fixation surface 311 defines therein first mounting holes 313, and the second fixation surface 312 defines therein second mounting holes 314. Each of the top partition panel 11, the bottom partition panel 12, and the at least one intermediate partition panel 13 defines therein at least one row of third through holes 114, 124, 134 proximate to and along the arc edge 111, 121, 131 in a manner of a regularly spaced arrangement. Positions of the at least one row of third through holes 114, 124, 134 correspond to positions of the first mounting holes 313 of the plurality of L-shaped fixation members 31. Positions of the second mounting holes 314 of the plurality of L-shaped fixation members 31 corresponds to the first through holes 245 defined in the first longitudinal strips 241 and the second longitudinal strips 242. In this way, the equally spaced arrangement of the L-shaped fixation member 31 along the arc edge of each of the top partition panel 11, the bottom partition panel 12, and the at least one intermediate partition panel 13 is achieved, such that the plurality of module supports 24 are equally spaced part by the plurality of L-shaped fixation members 31 along the arc edge of each partition panel.

Figure 7:
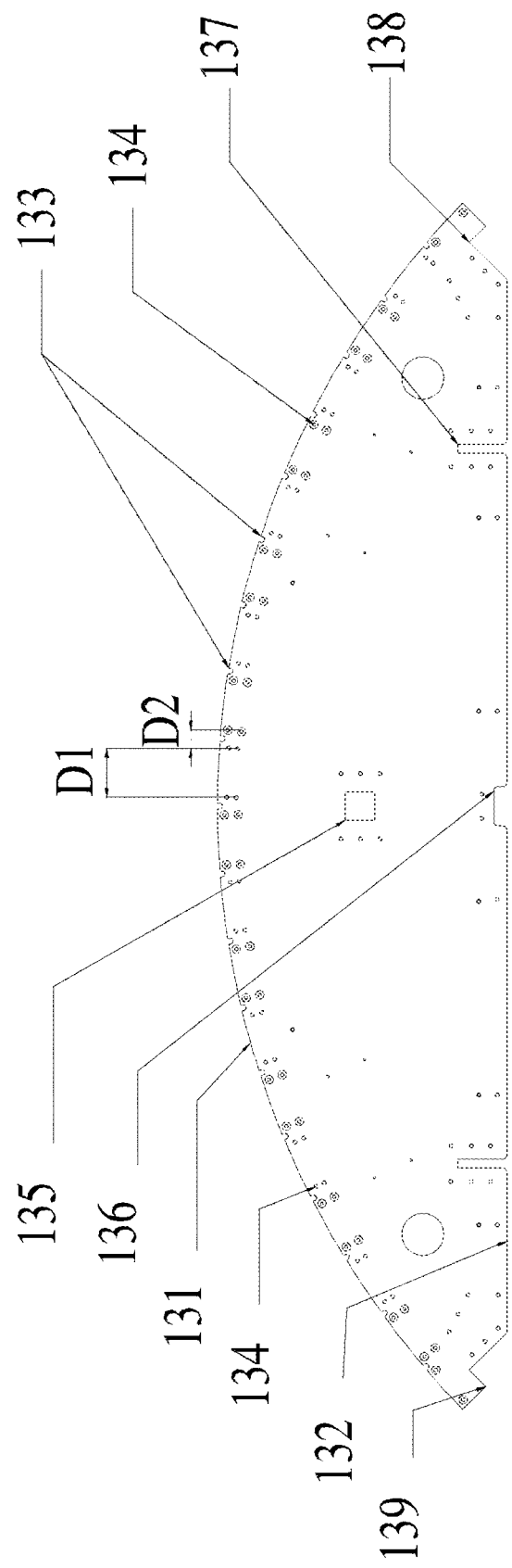
FIG. 7 is a top view of an intermediate partition panel according to an embodiment of the present application.
Figure 8:
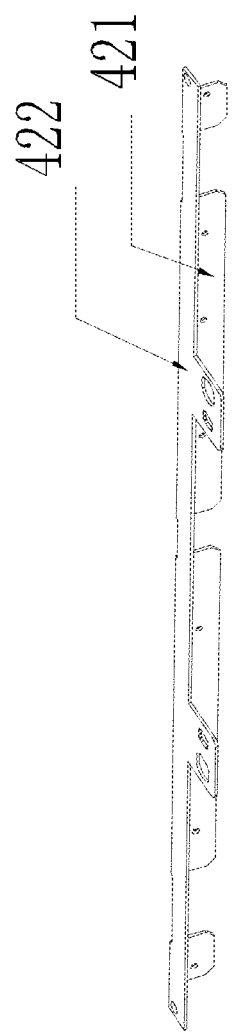
FIG. 8 is a perspective view of a bottom crossbeam according to an embodiment of the present application.

In some embodiments of the present application, as shown in in FIG. 7, the regularly spaced arrangement of the at least one row of third through holes 114, 124, 134 refers to that each third through hole has a first distance D1 and a second distance D2 away from two adjacent third through holes in the same row along the arc edge respectively. The first distance D1 corresponds to an interval between the first mounting holes 313 of each L-shaped fixation member 31 along the arc edge. The second distance D2 is smaller than a sum of a peripheral length of the first longitudinal strip 241 and a peripheral length of the second longitudinal strip 242 along the arc edge, and greater than a peripheral length of the stiffener 244 along the arc edge.

Figure 2:
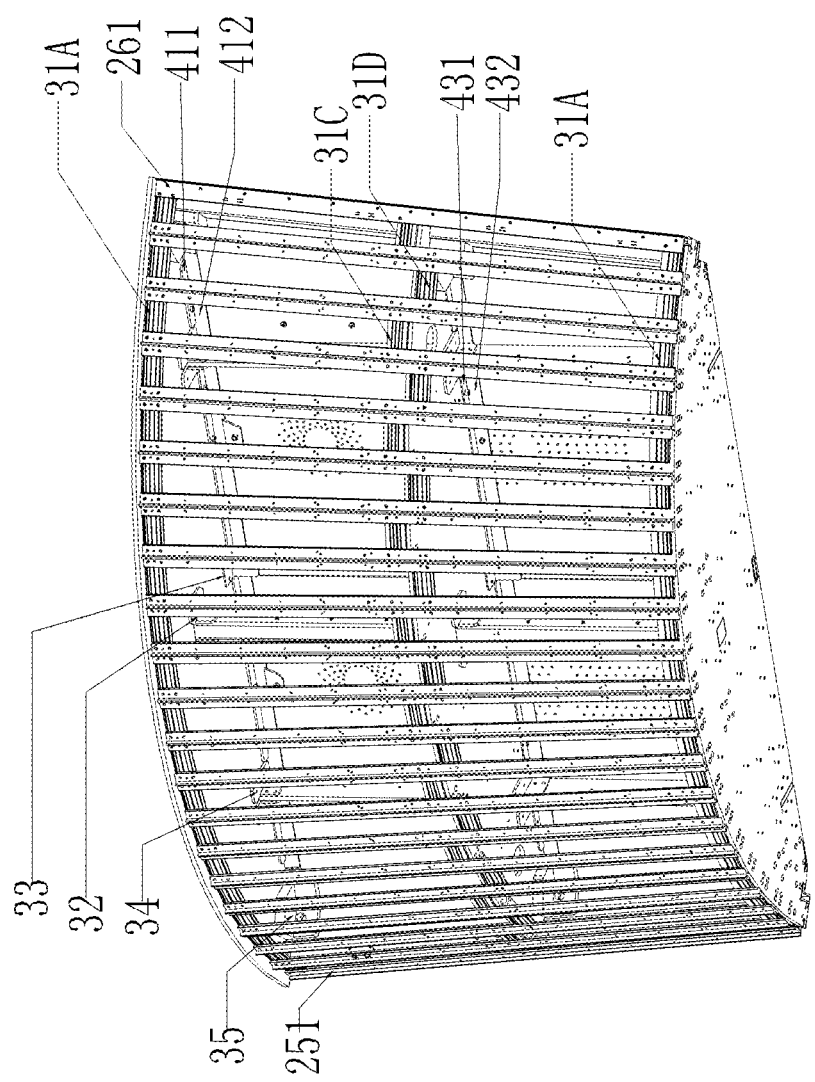
FIG. 2 is a bottom, front, right side perspective view of a frame for installing an arc-shaped LED display screen according to an embodiment of the present application.

In some embodiments of the present application, as shown in FIGS. 2 and 9, the plurality of L-shaped fixation members 31 comprise: first L-shaped fixation members 31A, second L-shaped fixation members 31B, third L-shaped fixation members 31C, and fourth L-shaped fixation members 31D. The first L-shaped fixation members 31A are installed at a bottom surface of the top partition panel 11 and configured to fix tops of the plurality of module supports 24 at the arc edge 111 of the top partition panel 11. The second L-shaped fixation members 31B are installed at an upper surface of the bottom partition panel 12 and configured to fix bottoms of the plurality of module supports 24 at the arc edge 121 of the bottom partition panel 12. The third L-shaped fixation members 31C and the fourth L-shaped fixation members 31D are alternately arranged along an upper surface and a lower surface of the at least one intermediate partition panel 13 and configured to fix middle portions of the plurality of module supports 24 at the arc edge 131 of the at least one intermediate partition panel 13. An included angle of each first L-shaped fixation member 31A is equal to an included angle of each fourth L-shaped fixation member 31D. An included angle of each second L-shaped fixation member 31B is equal to an included angle of each third L-shaped fixation member 31C. A sum of the included angle of each third L-shaped fixation member 31C and the included angle of each fourth L-shaped fixation member 31D equals to 180 degrees.

In practice, the included angles of first L-shaped fixation members 31A, the second L-shaped fixation members 31B, the third L-shaped fixation members 31C, and the fourth L-shaped fixation members 31D can be adjusted according to practical needs, so as to make all the top partition panel 11, the bottom partition panel 12, and the at least one intermediate partition panel 13 are in parallel to the horizontal plane, or alternatively, having a certain angle with respect to the horizontal plane.

In some embodiments of the present application, as shown in FIGS. 1, and 5-7, the top partition panel 11, the bottom partition panel 12, and the at least one intermediate partition panel 13 respectively define in middle portions thereof first openings 115, 125, 135. The first openings 115, 125, 135 are aligned with each other and have the same shape fitting with a cross section of the primary support 21, to allow the primary support 21 to pass through the corresponding first openings 115, 125, 135 and to be fixed at each of the top partition panel 11, the bottom partition panel 12, and the at least one intermediate partition panel 13 along vertical direction via a plurality of first fixation seats 32.

The shape of the cross section of the primary support 21 is not uniquely limited herein. In some embodiments, the cross section of the primary support 21 may be a rectangular shape, and correspondingly, the first openings 115, 125, 135 adopt the same rectangular shape. In some embodiments, the cross section of the primary support 21 may be a square shape, and correspondingly, the first openings 115, 125, 135 adopt the same square shape.

In some embodiments, the primary support is perpendicular to the planar surface of the top partition panel 11, the bottom partition panel 12, and the at least one intermediate partition panel 13.

In some embodiments of the present application, the top partition panel 11, the bottom partition panel 12, and the at least one intermediate partition panel 13 respectively define second openings 116, 126, 136 proximate to a center of the linear edge 112, 122, 132. The second openings 116, 126, 136 are aligned with each other and have the same shape fitting with a cross section of the secondary support 22, to allow the secondary support 22 to pass through the corresponding second openings 116, 126, 136 and to be fixed at each of the top partition panel 11, the bottom partition panel 12, and the at least one intermediate partition panel 13 along vertical direction via a plurality of second fixation seats 33.

The shape of the cross section of the secondary support 22 is not uniquely limited herein. In some embodiments, the cross section of the secondary support 22 may be a rectangular shape, and correspondingly, the second openings 116, 126, 136 adopt the same rectangular shape.

In some embodiments, a length direction of the cross section of the secondary support 22 is in parallel to the linear edge.

Figure 5:
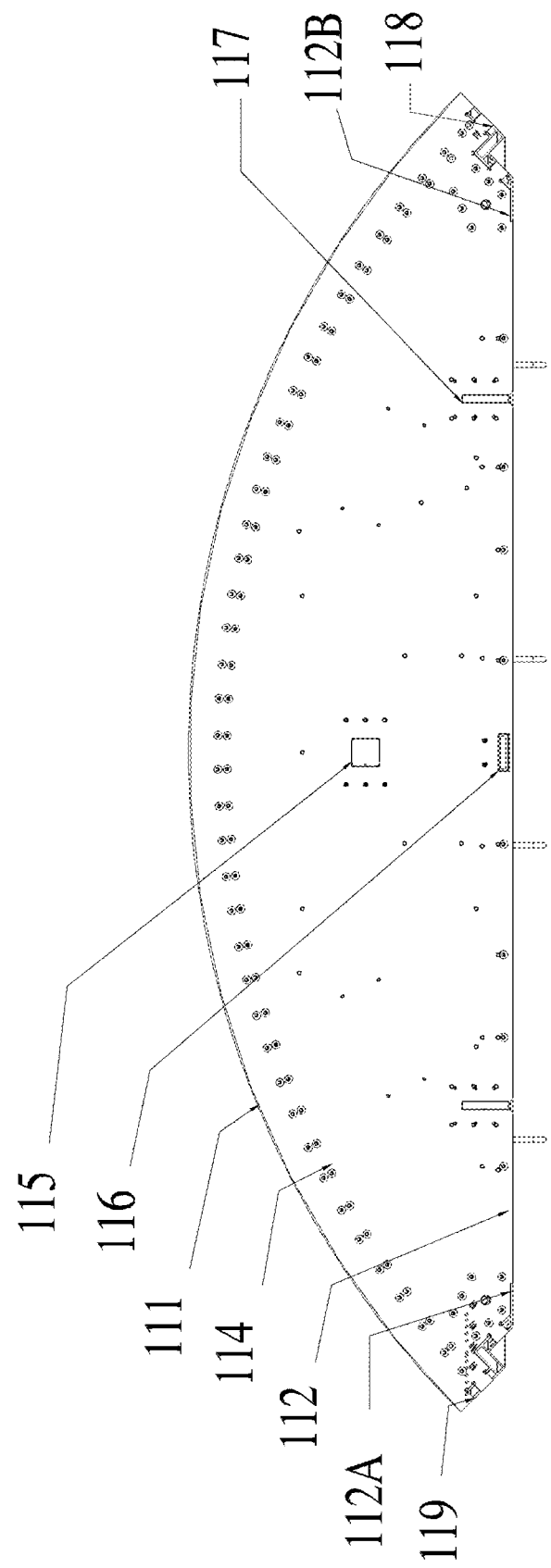
FIG. 5 is a top view of a frame for installing an arc-shaped LED display screen according to an embodiment of the present application.

In some embodiments of the present application, as shown in FIGS. 5-7, on each of the top partition panel 11, the bottom partition panel 12, and the at least one intermediate partition panel 13, a connection line connecting a center of a corresponding first opening 115, 125, 135 and a center of a corresponding second opening 116, 126, 136 passes through a center of a circle where the corresponding arc edge 111, 121, 131 is located.

That is, the connection line coincides with the radial direction of the circle where the arc edge is located. The assembled frame is a symmetrical structure with respect to a plane passing through the primary support and the secondary support, the configuration thereof is very stable, and can bear external forces exerted thereon. Thus, the integral frame has enhanced structural strength and high stability, which further enables to remove steel structures and to directly bearing forces by the frame structure.

In some embodiments of the present application, as shown in FIG. 1, each of the top partition panel 11, the bottom partition panel 12, and the at least one intermediate partition panel 13 respectively defines two third openings 117, 127, 137, which are proximate to the linear edge 112, 122, 132 and equally spaced apart from the center of the linear edge 112, 122, 132. Two tertiary supports 23 respectively pass through the corresponding two third openings 117, 127, 137 at the top partition panel 11, the bottom partition panel 12, and the at least one intermediate partition panel 13, so as to be fixed at each of the top partition panel 11, the bottom partition panel 12, and the at least one intermediate partition panel 13 via a plurality of third fixation seats 34. Projections of longitudinal directions of the two tertiary support 23 and projections of the linear edges 112, 122, 132 onto a rear face of the frame form an isosceles trapezoid configuration.

The shape of the cross section of each tertiary support 23 is not uniquely limited herein. In some embodiments, the cross section of the tertiary support 23 may be a rectangular shape, and correspondingly, each third opening 117, 127, 137 adopts the same rectangular shape.

Figure 3:
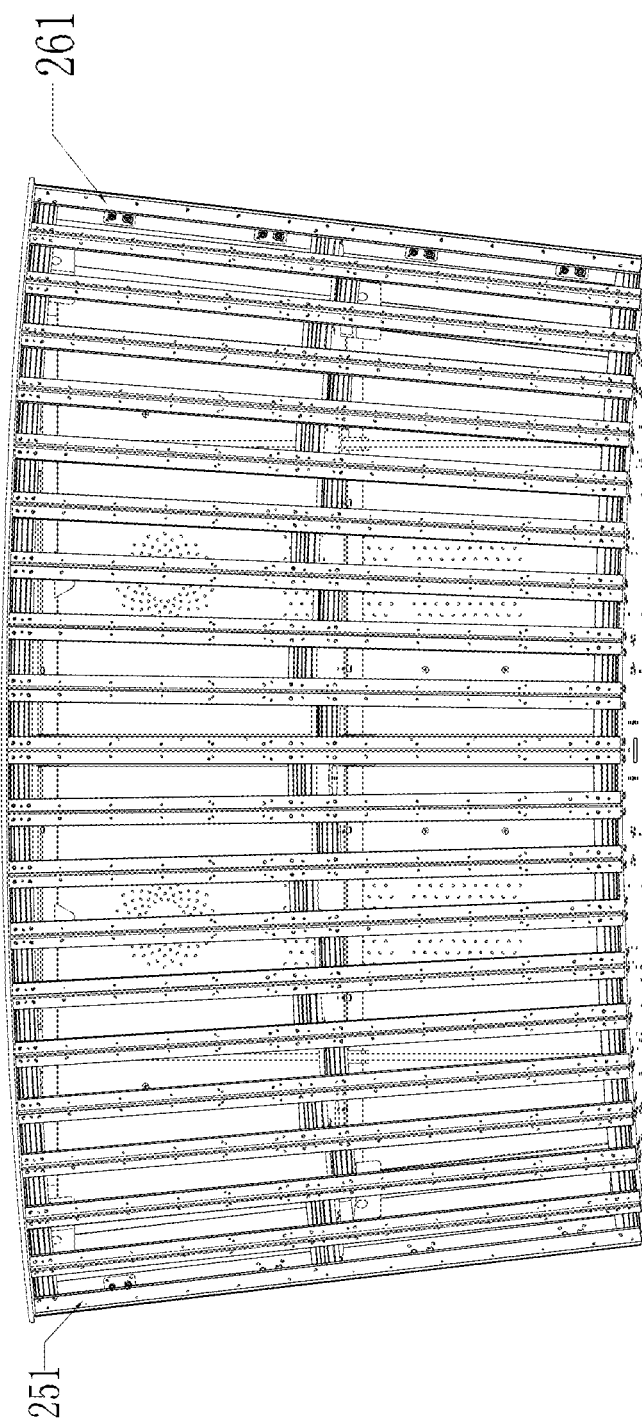
FIG. 3 is a front view of a frame for installing an arc-shaped LED display screen according to an embodiment of the present application.

In some embodiments of the present application, as shown in FIGS. 2-3, the left support 25 has a left longitudinal strip 251, and the right support 26 has a right longitudinal strip 261. When the left support 25 and the right support 26 are installed in place, cross sections of the left longitudinal strip 251, the right longitudinal strip 261, the first longitudinal strip 241, and the second longitudinal strip 242 are arranged in an arc arrangement corresponding to the arc edge 111, 121, 131.

In some embodiments of the present application, as shown in FIGS. 1-7, a top and a bottom of the left support 25 are in connection with the left edge 118 of the top partition panel 11 and the left edge 128 of the bottom partition panel 12 respectively via mortis-and-tenon joints; and a middle portion of the left support 25 abuts against the left edge 138 of the at least one intermediate partition panel 13. A top and a bottom of the right support 26 are in connection with the right edge 119 of the top partition panel 11 and the right edge 129 of the bottom partition panel 12 respectively via mortis-and-tenon joints; and a middle portion of the right support 26 abuts against the right edge 139 of the at least one intermediate partition panel 13.

By adopting the mortis-and-tenon joints, the top partition panel 11 and the bottom partition panel 12 are fixedly supported by the left support 25 and the right support 26 at the left edges and the right edges, respectively, which ensures the angle accuracy after assemblage. In addition, fixation seats 35 may be adopted to fasten the connection between an inner lateral surface of each of the left support 25 and the right support 26 and the planar surface of each of the top partition panel 11 and the bottom partition panel 12 and the at least one intermediate partition panel 13, such that the stable connection at the left and right side of the frame is further enhanced. Thus, the integral frame has enhanced structural strength and high stability, which further enables to remove steel structures and to directly bearing forces by the frame structure.

On each of the top partition panel, the bottom partition panel, and the intermediate partition panel, the left edge and the right edge are symmetrical with each other, with respect to the connection line connecting the center of the corresponding first opening and the center of the corresponding second opening 116, 126, 136.

In some embodiments, the left edge 118, 128, 138 and the right edge 119, 129, 139 are substantially zigzag edges, and cross sections of the left support 25 and the right support 26 also adopt a substantially zigzag shapes, whereby realizing the fitting between the corresponding edges and left or right support.

An outer lateral surface of each of the left support 25 and the right support 26 is configured to be aligned and connected with corresponding outer lateral surface of the left or right support of adjacent frames via proper connection means. The proper connection means are not uniquely limited herein. In some embodiments, the outer lateral surface of each of the left support 25 and the right support 26 may define therein through holes, such that the adjacent frames can be connected by bolts and screws installed in the through holes.

In some embodiments of the present application, as shown in FIGS. 1-6, the linear edge 112 of the top partition panel 11 and the linear edge 122 of the bottom partition panel 12 are aligned to form a plane, and the linear edge 132 of the at least one intermediate partition panel 13 are located at one side of the plane facing the arc edge 131. Planar surfaces of the top partition panel 11, the at least one intermediate partition panel 13, and the bottom partition panel 12 gradually reduce from top to bottom, making an arc mounting surface of the frame for installing the arc-shaped LED display screen represent a portion of an inverted cone.

In some embodiments of the present application, as shown in FIGS. 1-2, and 6, two ends of the linear edge 116 of the top partition panel 11 are provided with first step structures 112A, 112B. Two ends of the linear edge 126 of the bottom partition panel 12 are provided with second step structures 122A, 122B. A top and a bottom of a left baffle 27 are respectively accommodated in the first step structure 112A and the second step structures 122A at the left. A top and a bottom of a right baffle 28 are respectively accommodated in the first step structure 112B and the second step structures 122B at the right. A middle portion of the left baffle 27 and a middle portion of the right baffle 28 respectively abut against a linear edge 136 of the at least one intermediate partition panel 13.

The left baffle 27 and the right baffle 28 are fixed in proper position at the top partition panel 11, the bottom partition panel 12, and the at least one intermediate partition panel 13 and abut against the left support 25 and the right support 26, respectively, via a plurality of fourth fixation seats 35. Each fourth fixation seat 35 has three fixation surfaces, in particular, one fixation surface is in contact with the planar surface one of top partition panel 11, the bottom partition panel 12, and the at least one intermediate partition panel 13, another fixation surface is in contact with the longitudinal surface of the left baffle 27 or the right baffle 28, and the last fixation surface is in contact with the left support 25 or the right support 26. In this way, the top partition panel 11, the bottom partition panel 12, and the at least one intermediate partition panel 13 are further fixed to the left support 25 and the right support 26 via the plurality of fourth fixation seats 35.

In some embodiments of the present application, as shown in FIGS. 1-2, 4, and 8, linear edges 116, 126, 136 of the top partition panel 11, the bottom partition panel 12, and the at least one intermediate partition panel 13 are respectively installed with a top crossbeam 41, a bottom crossbeam 42, and at least one intermediate crossbeam 43. Each of the top crossbeam 41, the bottom crossbeam 42, and the at least one the intermediate crossbeam 43 comprises: a first crossbeam surface 411, 421, 431 and a second crossbeam surface 412, 422, 432. The first crossbeam surface 411, 421, 431 is configured to be fixed on each of the planar surfaces of the top partition panel 11, the bottom partition panel 12, and the at least one intermediate partition panel 13. The second crossbeam surface 412, 422, 432, has an included angle with respect to the first crossbeam surface 411, 421, 431, and is in parallel to the plane formed by the linear edge 112 of the top partition panel 11 and the linear edge 122 of the bottom partition panel 12.

The second crossbeam surface 412 of the top crossbeam 41 and the second crossbeam surface 422 of the bottom crossbeam 42 and the corresponding linear edges 112, 122 are respectively aligned, and together with the left baffle 27 and the right baffle 28, are located on the same plane.

Figure 4:
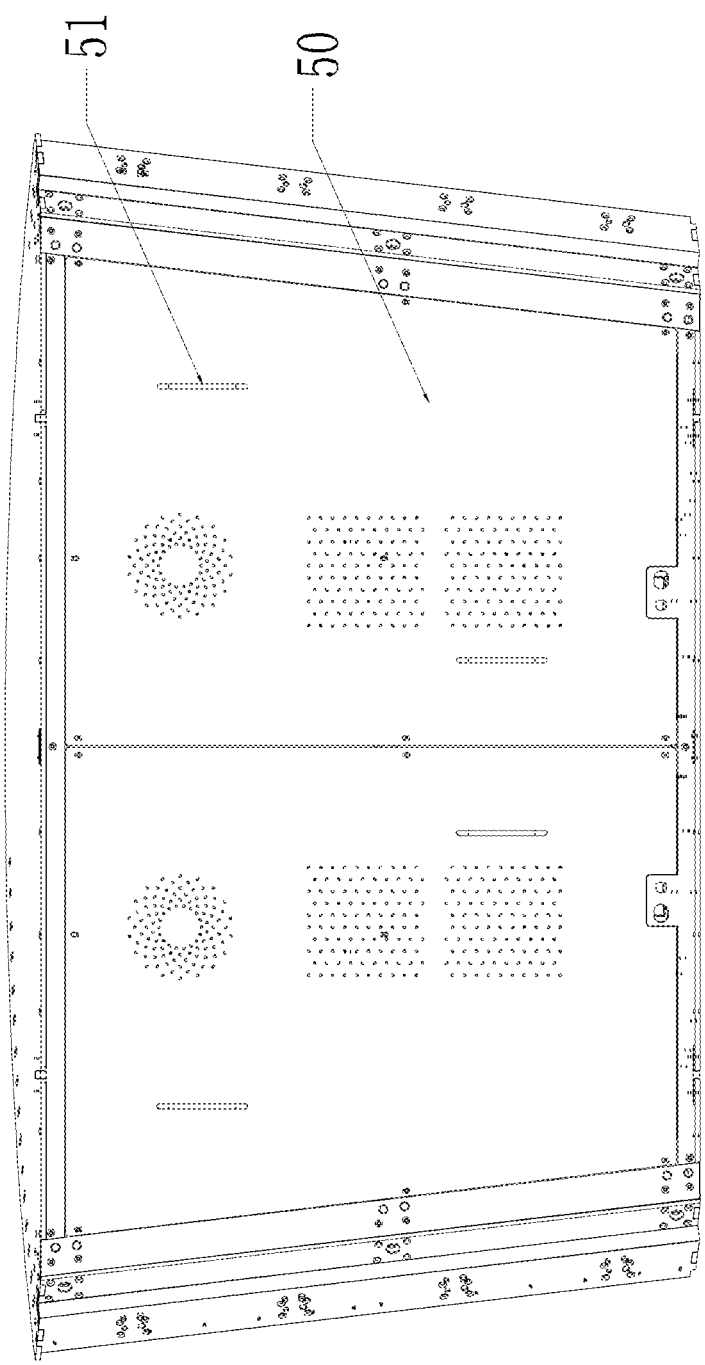
FIG. 4 is a rear view of a frame for installing an arc-shaped LED display screen according to an embodiment of the present application.

In some embodiments of the present application, as shown in FIGS. 1 and 4, the frame for installing an arc-shaped LED display screen further comprises a back cover 50. The back cover 50 is embedded in an isosceles trapezoid window enclosed by the left baffle 27, the right baffle 28, the top crossbeam 41, and the bottom crossbeam 42, and forms a planar surface together with the left baffle 27, the right baffle 28, the top crossbeam 41, and the bottom crossbeam 42.

In some embodiments, a handle 51 may be provided on the back cover 50 to pull the back cover 50 apart from the frame in necessary.

In some embodiments, the back cover 50 is provided with a hollow structure, which can reduce the weight thereof, as well as keep ventilation of the inner space.

In some embodiments, the primary support 21, the secondary support 22, the plurality of module supports 24, the left support 25 and the right support 26 adopt a drawn aluminum profile structure.

The terms "comprising," "having," "including," and "containing" are to be construed as open-ended terms i.e., meaning "including, but not limited to," unless otherwise noted. While particular embodiments of the present application have been shown and described, it will be obvious to those skilled in the art that changes and modifications may be made without departing from the present application in its broader aspects, and therefore, the aim in the appended claims is to cover all such changes and modifications as fall within the true spirit and scope of the present application.

What is claimed is:

1. A frame for installing an arc-shaped LED display screen composed of a plurality of LED display modules, the frame comprising:
a top partition panel and a bottom partition panel, wherein each of the top partition panel and the bottom partition panel is a planar panel and comprises:
an arc edge having the same arc;
a linear edge opposite to the arc edge; and
a left edge and a right edge in connection with the arc edge and the linear edge respectively at a left side and a right side;
the frame further comprising: a primary support, a secondary support, a plurality of module supports, a left support, and a right support;
wherein
the top partition panel and the bottom partition panel are parallel to and spaced apart from each other and are both fixed to the primary support, the secondary support, the plurality of module supports, the left support, and the right support;
the left support and the right support are configured to support the top partition panel and the bottom partition panel at the left edge and the right edge, respectively; and
the left support, the right support, and the plurality of module supports are equally spaced apart and fixed along the arc edge of each of the top partition panel and the bottom partition panel, and are configured to connect the plurality of LED display modules, to achieve a seamless assemblage of the arc-shaped LED display screen;
each of the plurality of module supports comprises: a first longitudinal strip and a second longitudinal strip, which are configured to connect with the plurality of LED display modules;
the first longitudinal strip and the second longitudinal strip are bent at an intersection portion thereof towards the arc edge to form an included angle α between the first longitudinal strip and the second longitudinal strip; and
the included angle α is smaller than 180 degree and satisfies that when the plurality of module supports are installed in positions, cross sections of all the first longitudinal strips and all the second longitudinal strips are in an arc arrangement corresponding to the arc edge.

2. The frame of claim 1, wherein
each of the plurality of module supports further comprises: a guide block, which is convex at the intersection portion of the first longitudinal strip and the second longitudinal strip in a direction away from the arc edge;
an end face of the guide block away from the arc edge is symmetrically bent along a bisector line of the included angle α to form a first end face A and a second end face B, wherein an included angle between the first end face and the second end face is the same as the included angle α; and
the first longitudinal strip and the second longitudinal strip have symmetrical structures along the bisector line of the included angle α between the first longitudinal strip and the second longitudinal strip.

3. The frame of claim 2, wherein
each of the plurality of module supports further comprises: a stiffener, which is convex at the intersection portion of the first longitudinal strip and the second longitudinal strip in a direction facing the arc edge.

4. The frame of claim 3, further comprising at least one intermediate partition panel; wherein
the at least one intermediate partition panel is a planar panel and comprises:
an arc edge, having the same arc as the arc edges of the top partition panel and the bottom partition panel, wherein centers of circles of the respective arc edges are disposed on a same line;
a linear edge opposite to the arc edge, and
a left edge and a right edge in connection with the arc edge and the linear edge respectively at a left side and a right side;
wherein
the at least one intermediate partition panel is fixed to the primary support, the secondary support, the plurality of module supports, the left support, and the right support and arranged between and in parallel to the top partition panel and the bottom partition panel;
the arc edge of the at least one intermediate partition panel is provided with notches arranged at equal intervals; and
each of the notches has a shape fitting with a cross section of the stiffener to receive the stiffener.

5. The frame of claim 4, wherein
each of the first longitudinal strip and the second longitudinal strip defines therein first through holes and second through holes;
the first through holes are configured to connect the corresponding first longitudinal strip or second longitudinal strip with a plurality of L-shaped fixation members via connecting pieces, such that the plurality of module supports are fixed to the top partition panel, the bottom partition panel, and the at least one intermediate partition panel via the plurality of L-shaped fixation members; and
the second through holes of each of the first longitudinal strip and the second longitudinal strip are configured to connect each of the plurality of module supports to one of the plurality of LED display modules via connecting pieces.

6. The frame of claim 5, wherein the plurality of L-shaped fixation members comprise:
first L-shaped fixation members, which are installed at a bottom surface of the top partition panel and configured to fix tops of the plurality of module supports at the arc edge of the top partition panel;
second L-shaped fixation members, which are installed at an upper surface of the bottom partition panel and configured to fix bottoms of the plurality of module supports at the arc edge of the bottom partition panel; and
third L-shaped fixation members and fourth L-shaped fixation members, which are alternately arranged along an upper surface and a lower surface of the at least one intermediate partition panel and configured to fix middle portions of the plurality of module supports at the arc edge of the at least one intermediate partition panel;
wherein
an included angle of each first L-shaped fixation member is equal to an included angle of each fourth L-shaped fixation member;
an included angle of each second L-shaped fixation member is equal to an included angle of each third L-shaped fixation member; and a sum of the included angle of each third L-shaped fixation member and the included angle of each fourth L-shaped fixation member equals to 180 degrees.

7. The frame of claim 5, wherein
each of the plurality of L-shaped fixation members comprises a first fixation surface and a second fixation surface, which form an included angle therebetween;
the first fixation surface is in connection with one of the top partition panel, the bottom partition panel, and the at least one intermediate partition panel; and
the second fixation surface is in connection with one of the plurality of module supports.

8. The frame of claim 7, wherein
the first fixation surface defines therein first mounting holes, and the second fixation surface defines therein second mounting holes;
each of the top partition panel, the bottom partition panel, and the at least one intermediate partition panel defines therein at least one row of third through holes proximate to and along the arc edge in a manner of a regularly spaced arrangement;
positions of the at least one row of third through holes correspond to positions of the first mounting holes of the plurality of L-shaped fixation members; and
positions of the second mounting holes of the plurality of L-shaped fixation members corresponds to the first through holes defined in the first longitudinal strips and the second longitudinal strips.

9. The frame of claim 8, wherein
the regularly spaced arrangement of the at least one row of third through holes refers to that each third through hole has a first distance and a second distance away from two adjacent third through holes in the same row along the arc edge respectively;
the first distance corresponds to an interval between the first mounting holes of each L-shaped fixation member of the plurality L-shaped fixation members along the arc edge; and
the second distance is smaller than a sum of a peripheral length of the first longitudinal strip and a peripheral length of the second longitudinal strip along the arc edge, and greater than a peripheral length of the stiffener along the arc edge.

10. The frame of claim 4, wherein
the top partition panel, the bottom partition panel, and the at least one intermediate partition panel respectively define in middle portions thereof first openings;
the first openings are aligned with each other and have the same shape fitting with a cross section of the primary support, to allow the primary support to pass through the corresponding first openings and to be fixed at each of the top partition panel, the bottom partition panel, and the at least one intermediate partition panel along vertical direction via a plurality of first fixation seats.

11. The frame of claim 4, wherein
the top partition panel, the bottom partition panel, and the at least one intermediate partition panel respectively defines second openings proximate to a center of the linear edge;
the second openings are aligned with each other and have the same shape fitting with a cross section of the secondary support, to allow the secondary support to pass through the corresponding second openings and to be fixed at each of the top partition panel, the bottom partition panel, and the at least one intermediate partition panel along vertical direction via a plurality of second fixation seats.

12. The frame of claim 11, wherein
on each of the top partition panel, the bottom partition panel, and the at least one intermediate partition panel, a connection line connecting a center of a corresponding first opening and a center of a corresponding second opening passes through a center of a circle where the corresponding arc edge is located.

13. The frame of claim 4, wherein
each of the top partition panel, the bottom partition panel, and the at least one intermediate partition panel respectively defines two third openings, which are proximate to the linear edge and equally spaced apart from a center of the linear edge;
two tertiary supports respectively pass through the corresponding two third openings at the top partition panel, the bottom partition panel, and the at least one intermediate partition panel, so as to be fixed at each of the top partition panel, the bottom partition panel, and the at least one intermediate partition panel via a plurality of third fixation seats; and
projections of longitudinal directions of the two tertiary supports and projections of the linear edges onto a rear face of the frame form an isosceles trapezoid configuration.

14. The frame of claim 4, wherein
the left support has a left longitudinal strip, and the right support has a right longitudinal strip;
when the left support and the right support are installed in place, cross sections of the left longitudinal strip, the right longitudinal strip, the first longitudinal strip, the second longitudinal strip are arranged in an arc arrangement corresponding to the arc edge.

15. The frame of claim 14, wherein
a top and a bottom of the left support are in connection with the left edge of the top partition panel and the left edge of the bottom partition panel respectively via mortis-and-tenon joints; and a middle portion of the left support abuts against the left edge of the at least one intermediate partition panel; and
a top and a bottom of the right support are in connection with the right edge of the top partition panel and the right edge of the bottom partition panel respectively via mortis-and-tenon joints; and a middle portion of the right support abuts against the right edge of the at least one intermediate partition panel.

16. The frame of claim 4, wherein
the linear edge of the top partition panel and the linear edge of the bottom partition panel are aligned to form a plane, and the linear edge of the at least one intermediate partition panel are located at one side of the plane facing the arc edge; and
planar surfaces of the top partition panel, the at least one intermediate partition panel and the bottom partition panel gradually reduce from top to bottom, making an arc mounting surface of the frame for installing the arc-shaped LED display screen represent a portion of an inverted cone.

17. The frame of claim 16, wherein
two ends of the linear edge of the top partition panel are provided with first step structures;
two ends of the linear edge of the bottom partition panel are provided with second step structures;
a top and a bottom of a left baffle are respectively accommodated in the first step structure and the second step structures at the left;

a top and a bottom of a right baffle are respectively accommodated in the first step structure and the second step structures at the right; and a middle portion of the left baffle and a middle portion of the right baffle respectively abut against a linear edge of the at least one intermediate partition panel.

18. The frame of claim 17, wherein linear edges of the top partition panel, the bottom partition panel, and the at least one intermediate partition panel are respectively installed with a top crossbeam, a bottom crossbeam, and at least one intermediate crossbeam; and each of the top crossbeam, the bottom crossbeam, and the at least one the intermediate crossbeam comprises:
- a first crossbeam surface, configured to be fixed on each of the planar surfaces of the top partition panel, the bottom partition panel, and the at least one intermediate partition panel; and
- a second crossbeam surface, having an included angle with respect to the first crossbeam surface, and being in parallel to the plane formed by the linear edge of the top partition panel and the linear edge of the bottom partition panel.

19. The frame of claim 18, further comprising a back cover; wherein the back cover is embedded in an isosceles trapezoid window enclosed by the left baffle, the right baffle, the top crossbeam, and the bottom crossbeam, and forms a planar surface together with the left baffle, the right baffle, the top crossbeam, and the bottom crossbeam.

* * * * *